United States Patent
Gabbert et al.

(10) Patent No.: US 6,785,305 B1
(45) Date of Patent: Aug. 31, 2004

(54) TUNEABLE, ADJUSTMENT-STABLE SEMICONDUCTOR LASER LIGHT SOURCE AND A METHOD FOR THE OPTICALLY STABLE, LARGELY CONTINUOUS TUNING OF SEMICONDUCTOR LASERS

(76) Inventors: Manfred Gabbert, Barnimstrasse 37, D-10249 Berlin (DE); Wolfgang Reinecke, Seestrasse 97B, D-15783 Zeuthen (DE)

( * ) Notice: Subject to any disclaimer, the term of this patent is extended or adjusted under 35 U.S.C. 154(b) by 0 days.

(21) Appl. No.: 09/077,957
(22) PCT Filed: Dec. 13, 1996
(86) PCT No.: PCT/DE96/02458

§ 371 (c)(1),
(2), (4) Date: Jun. 12, 1998

(87) PCT Pub. No.: WO97/22166

PCT Pub. Date: Jun. 19, 1997

(30) Foreign Application Priority Data

Dec. 14, 1995 (DE) .......................... 195 48 647

(51) Int. Cl.⁷ ................................ H01S 3/10
(52) U.S. Cl. ............... 372/20; 372/18; 372/23
(58) Field of Search .............. 372/18, 29, 32, 372/20, 23

(56) References Cited

U.S. PATENT DOCUMENTS

| 3,663,897 A | 5/1972 | Broom | ................. 359/238 |
|---|---|---|---|
| 4,907,237 A | * 3/1990 | Dahmani et al. | ............. 372/32 |
| 5,050,179 A | 9/1991 | Mooradian | ................... 372/92 |
| 5,172,390 A | 12/1992 | Mooradian | ................... 372/44 |
| 5,524,012 A | * 6/1996 | Wang et al. | .................. 372/23 |

FOREIGN PATENT DOCUMENTS

| DE | 2051328 | 3/1973 |
|---|---|---|
| DE | 2236505 | 1/1974 |
| EP | 0335691 A1 | 10/1989 |
| EP | 0525752 A1 | 2/1993 |
| EP | 0587154 A2 | 3/1994 |

OTHER PUBLICATIONS

"Specifying Laser Diode Optics", pp. 1–6.
"Characteristics Of Efficient Diode Laser Collimators", pp. 2–7.
Hiroshi Kakiuchida et al., "Characteristics of a Semiconductor Laser with External Feedback," IEEE Journal of Quantum Electronics, vol. 30, No. 9 (1994) 2087–2097.

(List continued on next page.)

*Primary Examiner*—Don Wong
*Assistant Examiner*—Cornelius Jackson

(57) ABSTRACT

The preferably highly antireflection coated facet of a laser chip is imaged by an optical system onto a reflector, as a result of which the adjustment tolerance is substantially increased by the cat's eye effect and, since the optical system is provided with a high longitudinal chromatic aberration, the wavelength can be tuned by shifting given parts of the total system relative to other parts of the total system. In this way a tunable semiconductor laser light source which is free from mode jumps and has at most two adjustable degrees of freedom can be produced.

15 Claims, 2 Drawing Sheets

OTHER PUBLICATIONS

Figure 1:
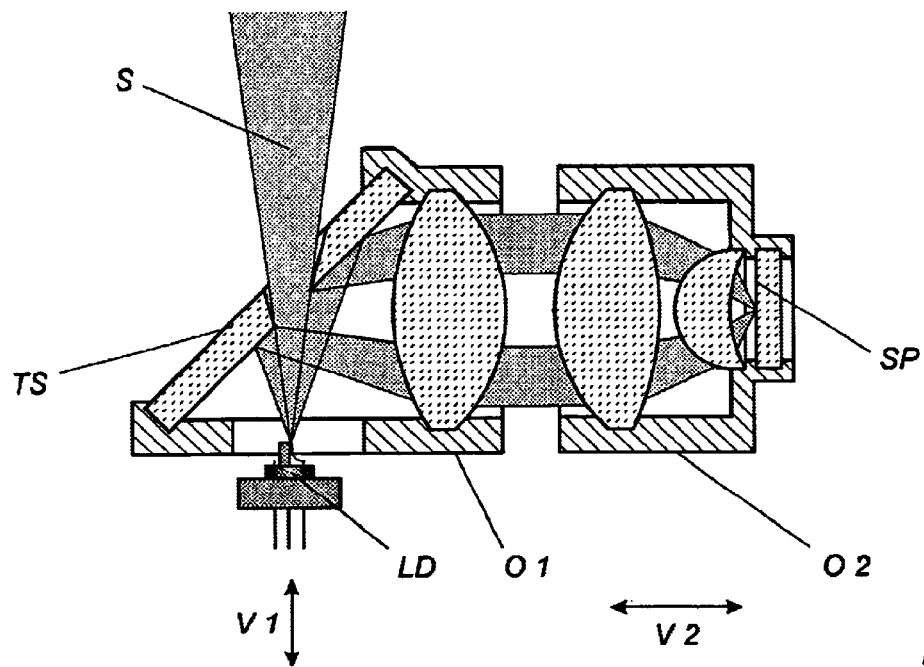

W. Fuhrmann, et al., "A Continuously Tunable GaAs Diode Laser With An External Resonator," Appl. Phys., B 49, 29–32, (1989).

F. Farvre et al., "External–Cavity Semiconductor Laser With 15 nm Continuous Tuning Range," Electronics Letters, vol. 22, No. 15 (1986), 795–796.

T. Wolf, et al., "Extended Continuous Tuning Range Over 10 nm) of Tunable Twin–Guide Lasers," Cleo '94, Anaheim, May 8–13, 1994, 185–186.

Hideaki Sato, et al., "Design of Nondispersion Optical Feedback System Using Diffraction Grating For Semiconductor Laser Multiple Longitudinal Modes Control," IEEE Transactions of Quantum Electronics, vol. QE–18 (1982), No. 2155–157.

P. Zorabedian, et al., "Interference–Filter–Tuned, Alignment–Stabilized, Semiconductor External–Cavity Laser," Optic Letters vol. 13, (1988) 10, 826–828.

* cited by examiner

TUNEABLE, ADJUSTMENT-STABLE SEMICONDUCTOR LASER LIGHT SOURCE AND A METHOD FOR THE OPTICALLY STABLE, LARGELY CONTINUOUS TUNING OF SEMICONDUCTOR LASERS

This application is the national phase under 35 U.S.C. §371 of prior PCT International Application No. PCT/DE96/02458 which has an International filing date of Dec. 13, 1996 which designated the United States of America, the entire contents of which are hereby incorporated by referenced.

The Invention relates to a laser light source, having a wide-band amplifying, narrow-band tunable medium, especially a semiconductor laser light source, which is characterized by the possibility of tuning the Laser wavelength, at least in broad ranges of the laser gain curve, without mode jumps, and at the same time by high optical stability. Possible areas of application for a light source of this type include optical spectroscopy.

Tunable light sources having a semiconductor laser as the active element are known in the art in many variations. Included among these are those light sources that enable continuous tuning in a more or less broad spectral range, or that permit, with the acceptance of wavelength jumps, the adjustment of any wavelength within a given interval.

To enable continuous tunability over a given wavelength range it is necessary, during the tuning of the emission wavelength of the laser, for the optical path length in the resonator cavity to change correspondingly and simultaneously, such that in single-mode operation the number of the oscillating longitudinal mode in the given range is maintained and mode jumps are prevented. Light sources of this type are known as monolithic components and as hybrid arrangements.

Monolithic components are characterized by their compactness and by the fact that the tuning of by the emission wavelength and the corresponding change of the optical path length within the resonator cavity can be synchronized using electronic means alone. The range of continuous tunability, however, is at least 2 to 5 times narrower than the laser gain curve. Up to now, a usable, continuous tuning range of 9 nm with a central wavelength of 1555 nm (corresponding to approx. 0.6%) has been achieved/T. Wolf, S. Illek, J. Rieger, B. Borchert, M. C. Axnann: Extended Continuous Tuning Range (over 10 nm) of Tunable Twin-Guide Lasers, Technical Digest Conference on Lasers and Electro-Optics (CLEO'94), Anaheim, May 8–13 1994. CWB1/.

Hybrid arrangements are comprised principally of a laser diode that is preferably highly antireflection-coated on one side, so that it will no longer act as a resonator, to the greatest extent possible, and an external resonator section that permits a wavelength-selective, tunable back coupling of the emitted light onto the antireflection-coated laser facet. This enables tuning over the entire gain curve of the laser. In principle, the adjustment of the resonator cavity length can occur separately from the selection of the back-coupled spectral range, without taking additional parameters into consideration. Up to now, however, only relatively complicated devices designed for use in implementing this adjustment more or less automatically have been known in the art. The following three solutions represent the state of the art.

The first solution was described by Favre, et al./ F. Favre, D. Le Guen, J. C. Simon, B. Landousies: External-Cavity Semiconductor Laser With 15 nm Continuous Tuning Range, Electronic Letters, Vol. 22. No. 15, Jul. 17, 1986, 795–796/. The light emanating from the antireflection-coated laser facet is collimated through an optic and travels, as a parallel bundle, at a specific angle, to a flat diffraction grating. The light which has been diffracted back into the direction of incidence returns, after traveling through the optic, to the laser. The special characteristic of this solution consists in that the rotation of the grating (tuning of the selected range) via two translational elements and one coupling rod is mechanically linked to the adjustment of the resonator cavity length, so that a continuous tuning of the laser wavelength is possible over 1.2% of the center wavelength. The positioning of the grating on a piezo translator permits small deviations to be corrected.

A significant disadvantage of this solution, as with many other arrangements, consists in that the laser light is naturally coupled back as a collimated bundle of rays. The result of this is that, in addition to the two degrees of freedom that are necessary for jump-free wavelength tuning (displacement and rotation of the grating), two additional degrees of freedom, which are not necessary for the adjustment of any base parameters, must be maintained in a highly sensitive state, in the optimum position. One of these is the tilting of the beam path perpendicular to the direction of dispersion for the grating, and the other is the displacement of the laser chip along the optical axis in relation to the collimator, in order to achieve the necessary precise imaging of the laser facet. Since the optically effective laser chip facet is very small, precise requirements are placed upon the precision and stability of the mechanics. This is complicated by the fact that within this two-dimensional possibility for adjustment there is only one optimum position and only one base parameter, namely the radiant power produced, that can be used as a scale. This disadvantage also applies correspondingly to the two following examples.

In/ W. Fuhrmann, W. Demtrbder: A Continuously Tunable GaAs Diode Laser With an External Resonator. Appl. Phys. B 49, 29–32 (1989), another hybrid arrangement is described. The connection between the selected spectral range and the optical path length in the resonator cavity is produced here via an electronic control device; the controlling element used to adjust the effective resonator cavity length is a Brewster plate that can be rotated via a galvanometric device. A total tuning range of 1.8% of the average emission wavelength, but only 0.014% of this continuously, is achieved.

EP 0335691.A1, H 01 S 3/08 contains a solution in which the change in resonator cavity length is achieved using a piezo translator alone. If tuning is to take place continuously over more than a fraction of a mode interval, an electronic control device is also required. Due to the limited adjustment path of the piezo translator, the continuously tunable range is also small in this arrangement.

The mechanical construction of the first solution alone permits continuous adjustment of the wavelength over a wide range, due to the long adjustment path for the resonator cavity length. The mechanics of this solution, however, naturally permit only slow tuning. The two other solutions permit continuous tuning over only narrow ranges.

For wavelength selection in lasers having a broad-band medium that can be stimulated, especially dye lasers, another arrangement is known in the art, which is treated in different variations in DE-AS 2051328, H 01 S 3/08 and the associated supplementary patent DE-OS 2236505, H 01 S 3/08. In these, the selection of wavelength is achieved primarily in that within the resonator cavity, the light is focused in a pinhole diaphragm, and behind this pinhole diaphragm an optic having a high degree of longitudinal chromatic aberration and a low degree of aperture aberration is positioned, such that in combination with one of the resonator cavity mirrors an imaging back into the pinhole diaphragm occurs without substantial loss, for only a narrow wavelength range. The tuning is effected by shifting the optic along its optical axis. In order to increase the selectivity, the optical axis of the selection arrangement is either shifted in relation to the geometric axis of the medium that can be stimulated or shifted to form an angle with it. The optic having the high degree of longitudinal chromatic aberration can be combined with the associated resonator cavity end mirror to form a single component, a Fresnel zone plate.

The contents of this patent relate exclusively to the selection of the wavelength. No reference is made to the behavior of the modes in the resonator cavity or to the stability of the arrangement.

The state of the art in the technology of increasing adjustment tolerances for lasers having external resonator cavities is determined principally by two solutions: The first solution is described in / P. Zorabedian and W. R. Trutna, Jr.: Interference-Filter-Tuned, Alignment-Stabilized, Semiconductor External-Cavity Laser, OPTICS LETTERS / Vol. 13, No. 10 (1988), pp 826 . . . 828/. To enable adjustment-tolerant back coupling of the laser beam, a cat's eye reflex reflector (collective lens with mirror in its focal plane) is used. As the selective element, an interference filter is found in the parallel ray path within the resonator cavity. To enable tuning of the laser wavelength, this filter is mounted such that it can be tilted. The coupling out of the usable beam follows from the facet of the laser chip that faces away from the external resonator cavity.

A further possibility for constructing an adjustment-stable laser having an external resonator cavity is contained in EP-O 525 752 A1 H 01 S 3/1055. In this case, as before, a cat's eye reflex reflector is used; in principle, however, its effect is limited to a single coordinate. With a specially designed combination of prisms an d cylindrical optics for formation of the beam, and using a diffraction grating as the reflector, the result is that an imaging of the laser facet onto the grating occurs only perpendicular to the direction of dispersion. In the direction of dispersion, however, the bundle of rays that reaches the grating is extensively parallel and relatively broad. The result is thus that the grating can be used without limits to tune-the laser wavelength, on the other hand, the positioning is largely tolerant to a tilting of the grating, perpendicular to the direction of dispersion.

The latter two solutions increase considerably the tolerance to tilting of the back-coupling beam path. There still remains, however, one degree of freedom that is not stabilized, namely the shifting of the laser chip in relation to the collimator along the optical axis, for the purpose of focusing the image of the laser facet onto the same. In addition, these solutions contain no wavelength tuning that is free from mode jumps.

Laser light sources that are continuously tunable over a broad range are necessary in the field of optical spectroscopy, among other areas. Their importance results, for example, from the fact that a mode-interval for traditional resonator cavity lengths amounts to approximately the width of one spectral line, thus, in the case of discontinuous tuning, correspondingly broad wavelength ranges will be jumped over.

Devices that are already available, all of which operate on the basic principle described by Favre, et al. (see above), contain, due to the high degree of adjustment sensitivity of the arrangement, means, such as active controls and/or a massive construction, that make them quite costly. It would be desirable to have a light source of this kind which would require considerably less expense for stabilization of the system, and would enable a more rapid tuning of the wavelength or a wavelength modulation.

The object of the invention consists in the creation of a semiconductor laser light source in which a high degree of stability is achieved as a result of the optical concept, and which, in addition, offers the possibility of jump-free tuning of the laser wavelength at least over broad partial ranges of the gain curve of the semiconductor material, due to the fact that the necessary connection between the selection of the back-coupled spectral range and the optical path length in the resonator cavity is provided in a simple and largely non-mechanical manner.

This object is attained in accordance with the invention with the characteristics of claims 1 and 11. The tunable semiconductor laser light source is formed from a hybrid arrangement, comprised principally of the following:

a laser chip, an optical system that is positioned such that it faces the emission facet of the laser chip, and possesses a high degree of longitudinal chromatic aberration, a first resonator cavity end mirror, which preferably is formed from the facet of the laser chip that is positioned such that it faces away from the optical system, and a second resonator cavity end mirror, designed as a reflector.

The high degree of longitudinal chromatic aberration is achieved via an appropriate configuration and via the selection of imaging scale for the optical system.

The term "emitting channel" is used to refer to the active zone of the preferably highly antireflection-coated laser chip, in which the stimulated emission appears. The ends of the emitting channel, at which the channel reaches the surface areas of the laser chip, are generally referred to as (naturally not clearly defined) "laser diode facets" or "facets of the laser chip," or specifically as "laser diode emission facets" or "emitting facets of the laser chip." In the corresponding connection, the laser diode emission facet is the laser facet that is advantageously highly antireflection coated and positioned such that it faces the optical system. The laser diode emission facet, to a certain extent, represents a window to the emitting channel. In addition, the radiation that proceeds from the laser chip is more or less astigmatic, depending upon the type of semiconductor laser used. The laser diode emission facet is thus not simply a luminescent surface. The radiation is coupled out of the chip from the emitting channel via the laser diode emission facet, is directed to the external portion of the resonator cavity arrangement, and finally, with a high degree of longitudinal chromatic aberration, is back coupled into the emitting channel via the laser diode emission facet. The high degree of longitudinal chromatic aberration of the imaging, in connection with the laser diode emission facet, which acts as a space filter, produces the selectivity of the arrangement.

In the following, the invention will be specified in greater detail using several exemplary embodiments. These show, in a schematic representation:

FIG. 1: the basic design of the laser light source.

Figure 2:
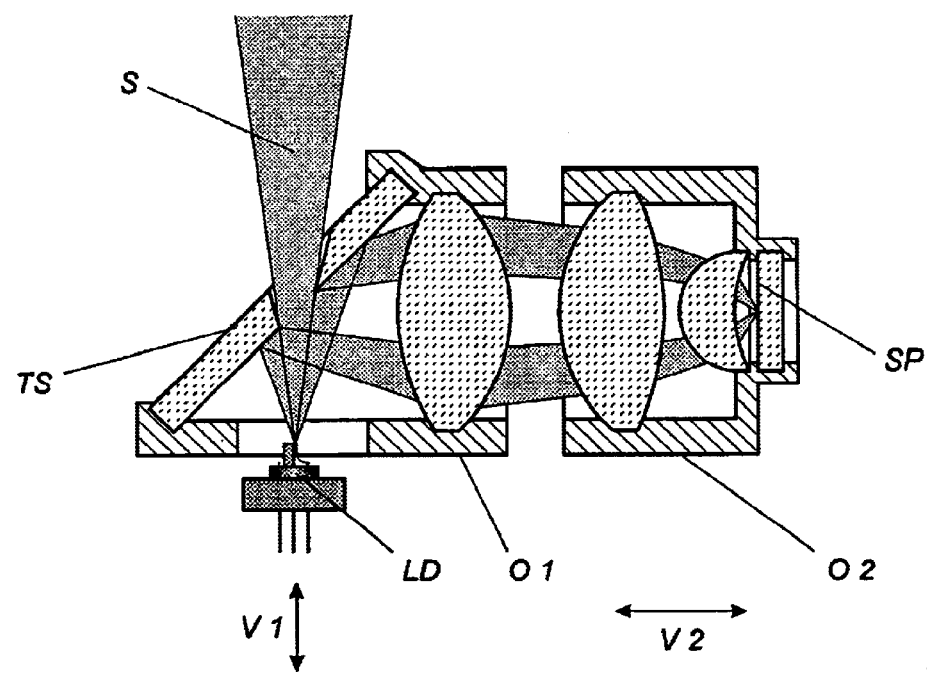
Figure 3:
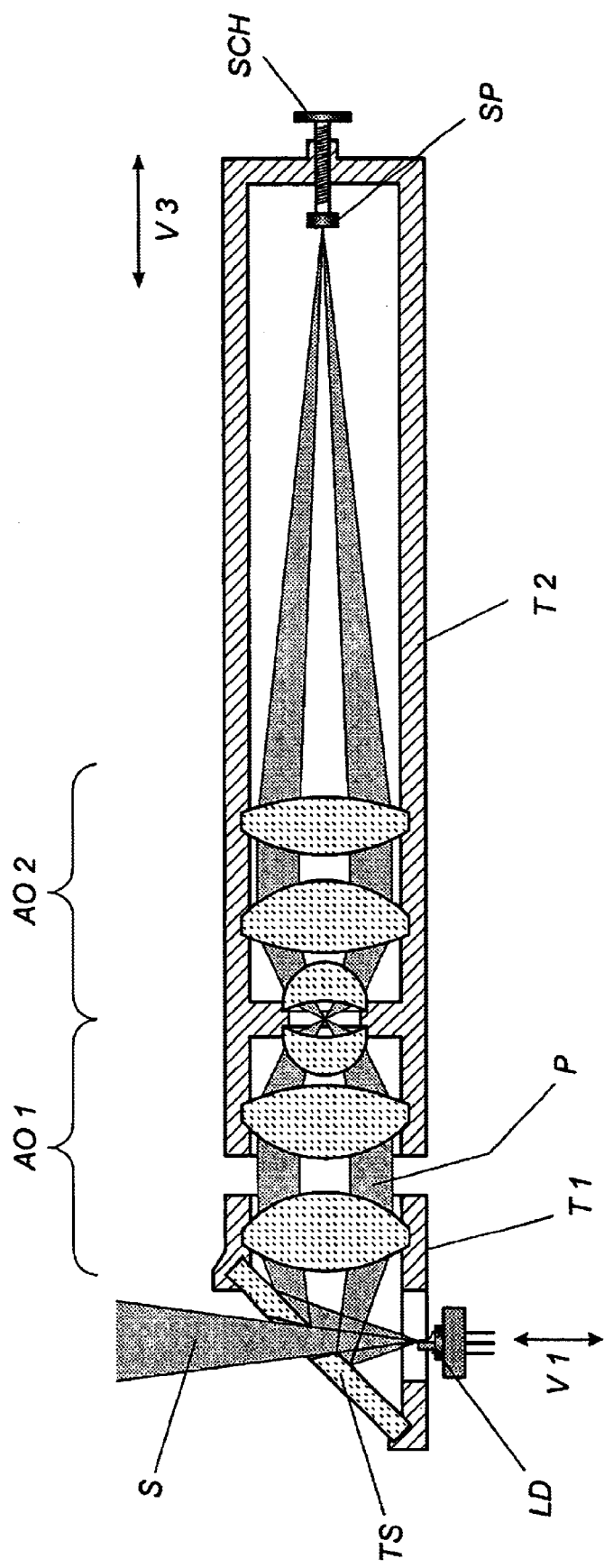

FIG. 2: a variation that has been improved in terms of continuous tunability, and FIG. 3: a design that permits an especially simple and rapid, continuous wavelength tuning.

In the most simple case (FIG. 1), the optical system is comprised of a first partial optic o 11, which contains as a major component a collimator KO, and a second partial optic O 12, which generates a reduced image of the laser facet onto the reflector SP, and contains this reflector. The coupling of the beam emitted from the laser chip LD into the optical system occurs via a separating mirror TS set at an angle of 45°, which is equipped with a conical boring around its optical axis. In this manner, only rays emanating from the laser chip LD with a minimum value in terms of numerical aperture reach the optical system. The bundle of rays having a lower beam angle which would damage the selectivity of the arrangement (since with these, the longitudinal chromatic aberration would be converted into only a slight transverse chromatic aberration at the position of the laser facet) is directed through the boring in the mirror TS and out of the resonator cavity as usable rays S.

At the position of the laser, there is a high degree of longitudinal chromatic aberration, so that single-mode operation of the laser light source can be achieved. By shifting the laser diode LD along the optical axis (arrow VI) the emission wavelength of the arrangement can be adjusted. The longitudinal chromatic aberration, however, cannot be increased here to the extent that the resonator cavity length changes to the same degree as the selected wavelength. Therefore, the tuning of the wavelength takes place first via a shifting of the second partial optic O 12 in relation to the first partial optic O 11 along the optical axis (arrow V 2), while at the same time, using a control device, the selected wavelength is tracked, via a shifting of the laser diode LD along the optical axis (arrow V 1), such that no mode jumps occur. In addition, the design of the second partial optic O 12 as a reflex reflector ensures a correspondingly very high level of tolerance to slight adjustment deviations in these movements. In this manner, wavelength tuning that is free from mode jumps is possible using only a single control device, which also allows, at the same time, for the influence of the dispersion in the laser chip itself Apart from that, normal additional active and/or passive stabilizations are omitted.

This object is attained in accordance with the invention with the characteristics of claims 1 and 11. The tunable semiconductor laser light source is formed from a hybrid arrangement, comprised principally of the following:
  a laser chip,
  an optical system that is positioned such that it faces the emission facet of the laser chip, and possesses a high degree of longitudinal chromatic aberration,
  a first resonator cavity end mirror, which preferably is formed from the facet of the laser chip that is positioned such that it faces away from the optical system,
  and a second resonator cavity end mirror, designed as a reflector.

The high degree of longitudinal chromatic aberration is achieved via an appropriate configuration and via the selection of imaging scale for the optical system.

A second variation of the laser light source (FIG. 2) makes use of an optical system that is very similar to that in Example 1, but with the difference that the first partial optic O 21 does not image the laser facet to infinity, but to a finite image distance, and correspondingly, the second partial optic O 22 is designed such that under these conditions it will generate an image of the laser facet onto the reflector SP. A shifting of the partial optic O 22 in the direction of the arrow V 2 thus results not only in a change in the resonator cavity length, as in Example 1, but also changes the focusing on the laser diode facet at the same time. Thus, the tuning of the laser wavelength may also be effected via a shifting of the second partial optic O 22 in relation to the first partial optic O 21 along the optical axis. At the position of the laser chip LD, basically the same longitudinal chromatic aberration as in Example 1 is achieved, so that the necessary selectivity of the arrangement is produced. With the proper selection of imaging scale for the first partial optic O 21 and a corresponding adjustment of the second partial optic O 22, however, it can be achieved here that, as desired, the optical path length in the resonator cavity changes to the same degree as the selected wavelength, so that mode jumps are largely prevented from the start. Since a mode jump caused by ambient influences or slight movements of the mechanics is possible, an electronic control device is also advantageous here. The control of small deviations in the connection between wavelength selection and change in resonator cavity length is achieved here via a very slight shifting of the laser diode along the optical axis (in the direction of arrow V 1), since a shifting V 1 in contrast to the shifting V 2 changes the wavelength selection greatly and the length of the resonator cavity to a lesser extent.

The advantage this variation has over Example 1 consists in that here wavelength tuning and corresponding changes in the length of the resonator cavity are achieved basically by adjusting only one coordinate (V 2), wherein both can be adjusted to agree with one another via the selection of a single image scale.

A third variation of the laser light source (FIG. 3) also establishes the connection between wavelength selection and corresponding change in length of the resonator cavity through optical means. The optical system of this design basically contains two complete imaging optics AO 1, AO 2 positioned opposite one another, and the reflector SP. The entire system is divided into two sections T 1 and T 2, between which a highly parallel path of rays P occurs. First, a reduced imaging of the laser facet via the first imaging optic AO 1, which generally corresponds to the optical system in Example 1, takes place. From the point of the image of the laser facet, however, the beam is not reflected into the same optic, rather it travels through a nearly identical imaging optic AO 2 in the opposite direction, after which it reaches the reflector SP. The difference of the second imaging optic AO 2 from the first imaging optic AO 1 consists primarily in that the image distance of the second imaging optic to the reflector SP is several times greater than the object distance of the first imaging optic to the laser chip LD. Thus, at the position of the laser, the desired high degree of longitudinal chromatic aberration is achieved, along with the simultaneous best possible exploitation of the angle of the laser beam and thus the necessary selectivity; at the same time, however, simply by the proper selection of image scale for the second imaging optic AO 2, the longitudinal chromatic aberration at the point of the image of the laser facet on the reflector SP is adjusted, such that through only a displacement of the reflector SP in the direction V 3, the emission wavelength of the laser light source, including the corresponding change in optical resonator cavity length, can be controlled. At the reflector, in this case, no greater beam angle is necessary, since the wavelength selection takes place only with the imaging of the laser facet. A slight shifting of the laser diode along the optical axis in this case also enables the correction of small deviations in the connection between wavelength selection and change in resonator cavity length. Between both sections T1, T2 of the system, the optical path is largely parallel. The length of the parallel ray path is variable within certain limits, so that there is a possibility for adjustment of the entire resonator cavity length. The reflector SP is mounted, for example, to a micrometer gauge SCH.

The advantage this arrangement has over Example 1 consists in that the longitudinal chromatic aberrations at the point of the laser chip and at the point of the reflector can be set independently of one another, and thus the continuous tunability via a shifting of only a single coordinate can be achieved; moreover, this variation has the advantage over Example 2 in that, as the tuning element, only the small, light reflector needs to be moved, which facilitates handling; in addition, the possibility of rapid wavelength modulation results, for example, from the fact that the reflector can be mounted to a piezo translator. Since modulation, as a rule, occurs over only a relatively small portion of the entire tuning range, the precision of the course of longitudinal chromatic aberration for the optics is sufficient. Thus, the control device need not be able to follow the modulation frequency. In contrast to known-in-the-art arrangements discussed above, in which a modulation of the laser wavelength can only take place via a change in the length of the resonator cavity, here the shifting of the laser is necessarily also connected to the corresponding shifting of the back-coupled spectral range, so that the oscillating laser mode can be continuously modulated over many mode intervals without difficulty.

List of Reference Figures Used

AO 1 Imaging optic 1
AO 2 Imaging optic 2
KO Collimator
LD Laser diode
O 11, O 21 First partial optic
O 12, O 22 Second partial optic
P Parallel beam path
S Usable laser radiation
SCH Micrometer gauge
SP Reflector
T 1 First section of resonator cavity
T 2 Second section of resonator cavity
TS Separating mirror
V 1 Displacement 1
V 2 Displacement 2
V 3 Displacement 3

What is claimed is:

1. Tunable semiconductor laser light source in which a laser chip (LD) with a first resonator cavity end mirror, an optical system that is positioned such that it faces the emission facet of the laser chip (LD), and a second resonator cavity end mirror designed as a reflector (SP) are comprised as a resonator cavity arrangement, where said optical system possesses such longitudinal chromatic aberration, that a diffraction-limited or nearly diffraction-limited imaging of the emission facet of the laser chip (LD) together with the bundle of rays therein, onto the reflector (SP) and back into the emission facet of the laser chip (LD), is performed only for a spectral range, that is always narrow in comparison with the laser gain curve, and therefore guarantees that, dependent upon the position of the laser chip (LD), or upon the positioning of the reflector (SP), or generally upon the position of certain parts (O 22) of the resonator cavity arrangement in relation to the remaining parts (LD+O 21) of the resonator cavity arrangement, along its optical axis, the laser light source in each case runs in only a narrow wavelength range, which encompasses in the ideal case only one mode of the resonator cavity arrangement while at the same time, a high level of tolerance to adjustment deviation in the construction is ensured by the cat's eye assembly which is formed from a part (O 12, O 22) of the optical system, including the reflector (SP).

2. Semiconductor laser light source in accordance with claim 1, characterized in that the first resonator cavity end mirror is formed from the facet of the laser chip (LD) that is positioned such that it faces away from the optical system.

3. Semiconductor laser light source in accordance with claim 2, characterized in that the facet of the laser chip (LD) that is positioned such that it faces away from the optical system is highly reflectively coated.

4. Semiconductor laser light source in accordance with claim 1, characterized in that the facet of the laser chip (LD) that is positioned such that it faces the optical system is highly antireflection coated.

5. Semiconductor laser light source in accordance with claim 1, characterized in that for back coupling only the bundle of rays proceeding from the laser diode (LD) and having a higher aperture is used, while the bundle having a lower aperture is directed out of the resonator cavity arrangement as the usable portion of radiation.

6. Semiconductor laser light source in accordance with claim 5, characterized in that for the optical coupling of the laser diode (LD) with the external portion of the resonator cavity arrangement, as well as for the coupling out of the usable radiation (S), a mirror (TS) is provided, that preferably is positioned at an angle of 45° to the optical axis of the laser chip (LD), and is bored through.

7. Semiconductor laser light source in accordance with claim 1, characterized in that the optical system is comprised of two partial optics (O 11, O 12), between which the beam path proceeds, largely parallel, and the distance between the two partial optics, including the associated remaining parts of the resonator cavity arrangement, can be adjusted, so that it is possible to change the optical path length in the resonator cavity without significantly altering the focusing which is dependent upon the wavelength; and in that with the corresponding, simultaneous adjustment of the distance between the two partial optics, including the associated remaining parts of the resonator cavity arrangement (LD+O 11 versus O 12) and the focusing (V 1), the laser wavelength is tunable such that the number of the oscillating main or single mode in the resonator cavity arrangement can be held constant, thus no mode jumps occur.

8. Semiconductor laser light source in accordance with claim 1, characterized in that the connection between wavelength selection and adjustment of resonator cavity length, which is required for jump-free wavelength tuning, is achieved either completely or to the greatest possible extent via shifting of only one part (O 22 in FIG. 2; SP in FIG. 3) of the resonator cavity arrangement along the optical axis in relation to the remainder of the resonator cavity arrangement (O 21+LD in FIG. 2; all parts aside from SCH with SP in FIG. 3).

9. Semiconductor laser light source in accordance with claim 8, characterized in that the first partial optic (O21) images the emitting facet of the laser diode, not to infinity, but rather to a finite image distance in such a way that merely via a shifting of the second partial optic (O22), including the reflector (SP), in relation to the first partial optic (O21), including the laser diode (LD), and the separating mirror (TS), both wavelength tuning and at least the most closely corresponding change in length of the resonator cavity results, preventing mode jumps.

10. Semiconductor laser light source in accordance with claim 8, characterized in that the optical system contains a first (AO 1) and a second (AO 2) imaging optic, wherein both possess a high degree of longitudinal chromatic aberration, and wherein the first imaging optic (AO 1) generates a reduced image of the laser emission facet, after which the second imaging optic (AO 2) projects an enlargement of this onto the reflector (SP), thus, first, the high degree of longitudinal chromatic aberration required for selection is present at the position of the laser emission facet, and second, independent of the first point, with the appropriate selection of imaging scale for the second imaging optic, the longitudinal chromatic aberration at the point of the reflector (SP) can be dimensioned, such that, with a shifting of the reflector (SP) along the optical axis, the wavelength selection and optical resonator cavity length will change analogous to one another, so that tuning can take place at least largely without mode jumps.

11. Method for tuning semiconductor lasers, wherein the laser diode emission facet is precisely imaged with and by means of the divergent radiation propagating from the emitting channel of the laser chip (LD), said Iradiation is reflected at the place of the image, such that the reflected radiation is back coupled through said laser diode emission facet into the emitting channel of the laser chip (LD), characterized in that the longitudinal chromatic aberration of the imaging is used to introduce a wavelength selection of said back coupled radiation, and therefore a tuning of the spectral range that is back coupled with the lowest losses occurring, is performed by variation of one or more optical distances within the imaging process, which vary at least the wavelength depending focusing of the imaging, whereas the image at the place of reflection one or more intermediate images can be preceded.

12. Method in accordance with claim 11, characterized in that the imaging from the emitting channel of the laser chip (LD) includes a correction for astigmatism.

13. Method in accordance with claim 11, characterized in that the facet of the laser chip (LD) that is positioned such that it faces the optical system is antireflection coated, thus the laser chip (LD) acts largely as an optical amplifier, including only one resonator cavity end mirror.

14. Method in accordance with claim 11, characterized in that the facet of the laser chip (LD) that is positioned such that it faces away from the optical system is highly reflection coated, thus only a small amount of radiant power passes out of the resonator via the laser chip (LD).

15. Method in accordance with claim 11, characterized in that, with an appropriate dimensioning of one or more imaging scales within the entire process, independent of the given selection of the wavelength range that is back coupled with the lowest losses, within the gain curve of the laser chip (LD), the number of oscillating main or single mode having, at most, slight deviations is always the same, therefore, with a tuning of the back coupled wavelength range no mode jumps occur, at least over several mode intervals, or tuning over basically the entire gain curve of the laser chip with, at the most, slight corrections of the optical path length is possible free of mode jumps.

* * * * *